United States Patent [19]

Sugimoto et al.

[11] Patent Number: 4,724,472
[45] Date of Patent: Feb. 9, 1988

[54] SEMICONDUCTOR DEVICE

[75] Inventors: Masahiro Sugimoto, Yokosuka; Tetsushi Wakabayashi, Yokohama; Kiyoshi Muratake, Kawasaki, all of Japan

[73] Assignee: Fujitsu Limited, Kawasaki, Japan

[21] Appl. No.: 6,347

[22] Filed: Jan. 14, 1987

Related U.S. Application Data

[63] Continuation of Ser. No. 579,127, Feb. 10, 1984, abandoned.

[30] Foreign Application Priority Data

Feb. 17, 1983 [JP] Japan .................... 58-025858

[51] Int. Cl.⁴ .................... H01L 23/02; H01L 23/12
[52] U.S. Cl. .................... 357/74; 357/80; 357/84
[58] Field of Search .................... 357/74, 80, 84

[56] References Cited

U.S. PATENT DOCUMENTS 3,561,107  2/1971  Best et al. .
4,338,621  7/1982  Braun .................... 357/74

FOREIGN PATENT DOCUMENTS 0027017  4/1981  European Pat. Off. .

OTHER PUBLICATIONS

Patent Abstracts of Japan, vol. 7, No. 27, Feb. 1983.
IBM Technical Disclosure Bulletin, vol. 18, No. 5, Oct. 1975, "Flexible Solder Connection and Method of Fabricating", by P. Geldermans, pp. 1379-1380.

Primary Examiner—Robert E. Wise
Attorney, Agent, or Firm—Staas & Halsey

[57] ABSTRACT

A semiconductor device to be mounted on a circuit board, including a semiconductor chip, a package for mounting the semiconductor chip, a plurality of conductor pads provided on the outer surface of the package, and a plurality of conductor pins, connected to the conductor pads in a substantially vertical contact condition, for connecting to the circuit board in accordance with a contacting condition.

12 Claims, 9 Drawing Figures

SEMICONDUCTOR DEVICE

This is a continuation of co-pending application Ser. No. 579,127, filed on Feb. 10, 1984, and now abandoned.

BACKGROUND OF THE INVENTION

1. Field of the Invention

The present invention relates to a package of a semiconductor device, more particularly to a structure of a package having pins which electrically connect to a circuit board, under a contacting condition.

2. Description of the Prior Art

In recent years, leadless packages, also known as chip carriers, have come into increasing use of accommodating integrated circuits (IC), large-scale integrated circuits (LSI), and the like. Like conventional packages with outer leads, leadless packages accommodate an IC chip therein and outer pads of the leadless package are electrically connected to the substrate and circuit board by soldering. They therefore can be used in popular assembly processes. At the same time, provision of conductor pads as outer pads in place of outer leads enables a more compact structure. Therefore, such packages can be mounted at a higher density on a circuit board, etc. compared with other packages. This highly prized feature has resulted in leadless packages being widely used in a broad range of fields.

There is, however, a problem with mounting the package to the substrate and circuit board by a rigid soldering technique in that the electrical connections tend to fracture during a heat procedure. Normally, the package, substrate, and circuit board are formed of different materials having different coefficients of expansion. During the heating required to accomplish the mounting and during normal operating conditions, the package, substrate, and the circuit board contract and expand at different rates, thereby generating stresses. These stresses can fracture the package, substrate, circuit board, or soldered conductor pads. The problem is compounded the greater the size of the devices on the circuit board. Such breakage, of course, has a fatal effect on the operation of the electronic circuits formed on the circuit board.

SUMMARY OF THE INVENTION

An object of the present invention is to eliminate the problem of heat-induced breakage between the package and circuit board.

Another object of the present invention is to provide a semiconductor device assembly in which reliability of the electronic circuits formed on the circuit board can be increased.

In accordance with an aspect of the invention, there is provided, a semiconductor device for mounting on a circuit board, comprising: a semiconductor chip; a package for mounting the semiconductor chip; a plurality of conductor pads provided on the outer surface of the package; and a plurality of conductor pins, connected to the conductor pads under a substantially vertical contact condition, for connecting to the circuit board under a contacting condition.

In accordance with another aspect of the invention, there is provided a semiconductor device assembly comprising: a semiconductor chip; a package for mounting the semiconductor chip; a plurality of first conductor pads provided on the outer surface of the package; a plurality of conductor pins fixed to the first conductor pads under a substantially vertical contact condition; and a circuit board having a plurality of second conductor pads corresponding to the conductor pins, the conductor pins being connected to the second conductor pads of the circuit board under a contacting condition.

BRIEF DESCRIPTION OF THE DRAWINGS

The above and other objects and advantages of the present invention will be more apparent from the following description of the preferred embodiments with reference to the accompanying drawings, wherein.

DESCRIPTION OF THE PREFERRED EMBODIMENTS

Before describing the preferred embodiments of the invention, an explanation will be made of the prior art for comparative purposes, with reference to FIGS. 1A to 3.

Figure 1A:
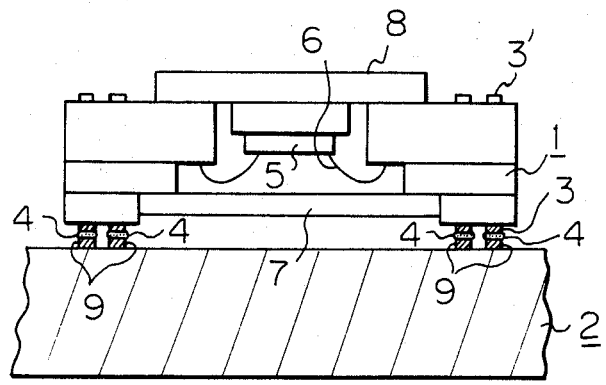
FIG. 1A is a partial cross-sectional view of a conventional semiconductor device assembly.

FIG. 1A is a partial cross-sectional view of a conventional semiconductor device assembly comprising a plurality of LSI's in packages, and a circuit board.

In FIG. 1A, there is a package 1 electrically connected to a circuit board 2 through conductor pads 3 and solder 4. Reference numerals 5, 6, 7, and 8 denote an IC chip, wiring, a cap, and a heat sinking plate, respectively.

Figure 1B:
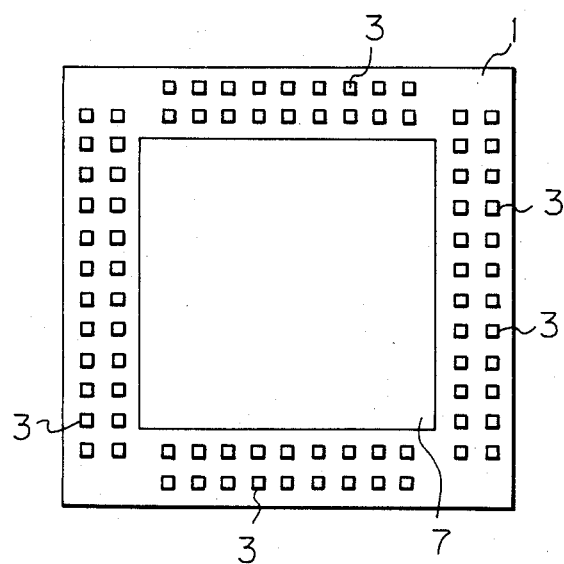
FIG. 1B is a schematic plane view of the package of FIG. 1A.

FIG. 1B is a schematic plane view of the package of FIG. 1A.

There are a plurality of conductor pads 3, for example, from 200 to 300, in the LSI. Connecting electrodes 9 provided on the circuit board 2 are connected to the conductor pads 3 of the package 1 by the solder 4, which has a thickness of about 50 μm.

When thermal shock is generated during the operation of the circuit, the soldered connecting portion sometimes breaks, e.g., the solder cracks and falls off or the connecting electrodes 9 are separated from the circuit board 2. The main reason for the heat-induced breakage is that the circuit board 2 is made of epoxy, polyimide, or other organic resins, which have a large thermal expansion coefficient, while the package 1 is made of ceramic, which has a small thermal expansion coefficient. Thus, the stress is given to the soldered connecting portion.

The circuit board 2 can be made of ceramic too, which would eliminate the stress problem and thus, breakage of the soldered connecting portions. However ceramic has a high dielectric constant and would slow down the operation of the electronic circuits. Thus, ceramic is unsuitable for circuit boards except in special cases.

Figure 2:
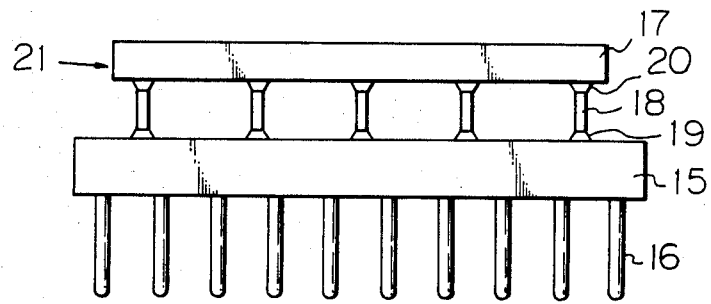
FIG. 2 is a schematic view of a conventional semiconductor device.

FIG. 2 is a schematic view of a semiconductor device disclosed in IBM Technical Disclosure Bulletin, vol. 18, No. 5, October 1975, PP 1379-1380.

In FIG. 2, a semiconductor device 17 is mounted and connected to a carrier 15 provided with pins 16 through a plurality of flexible strands 18. The bottom ends of the flexible strands 18 are aligned with solder mounds 19 on the top surface of the carrier 15. The top ends of the flexible strands 18 are connected to solder mounds 20 on the semiconductor device 17.

In this structure, the flexible strands form an electrical connection between the package and substrate. They are typically formed of thin copper wire. The strands are not, however, strong enough to be used advantageously as connecting portions between a package and circuit board. That is, since the strands are flexible, it becomes very complicated to assemble these flexible strands 18 to the semiconductor device 17 and the carrier 15. In fact, this publication discloses a complicated method where a special interposer 16 is used for assembling. In addition, the flexible strands 18 have a problem in which, the structure has a weak kinetic intensity against the pressure 21 in the horizontal direction.

Figure 3:
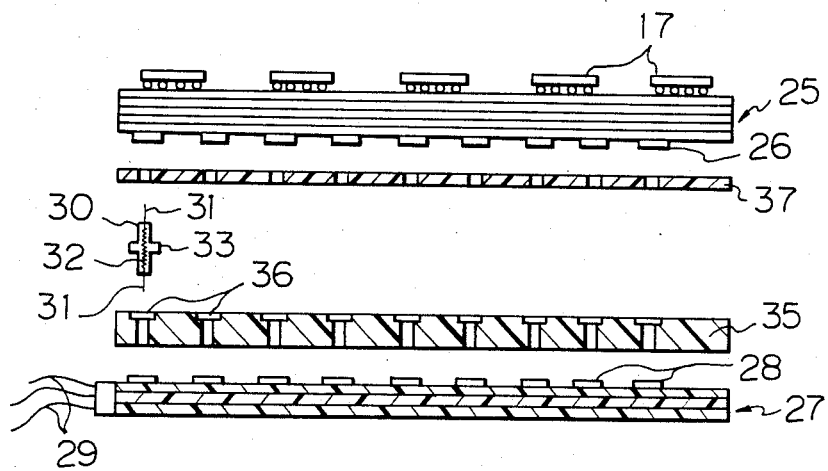
FIG. 3 is a cross-sectional view of a conventional semiconductor device assembly.

FIG. 3 is a cross-sectional view of a conventional semiconductor device assembly disclosed in IBM Technical Disclosure Bulletin, vol. 19, No. 4, September 1976, PP 1207-1271.

As shown in FIG. 3, a multilayer ceramic substrate 25, with semiconductor devices 17 mounted on the top surface, is provided with a plurality of pads 26 on the bottom surface. The multilayer ceramic substrate 25 is electrically connected to a multilayer laminated input-/output distribution board 27 provided with pads 28 and wiring 29 through a spring-biased pin contact element 30 which includes a pair of slidably mounted pins 31 biased by a suitable spring 32 including a flange 33. The spring-biased pin contact element 30 is mounted on a socket board 35 provided with a suitable aperture 36. A socket retainer board 37 is disposed over the element 30 retaining it in position. Such a structure is not suitable for high density integration. The reason for this is that the socket board 35 provides holes through which every flange 33 penetrates. Making holes for connecting pins, i.e., flanges, means a reduction of pin density and an increase of the package size of the semiconductor device.

Figure 4:
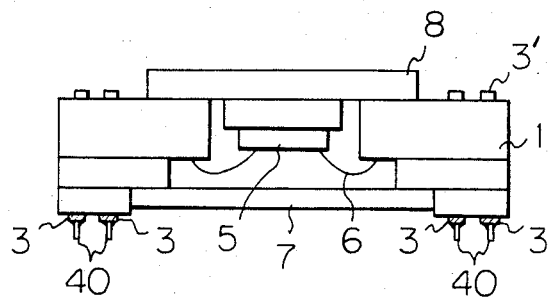
FIG. 4 is an elevational, partially cross-sectional view of an embodiment of a package according to the present invention.

FIG. 4 is an elevational, partially cross-sectional view of an embodiment of a package according to the present invention. In FIG. 4, a package 1 is provided with conductor pins 40 through conductor pads 3. The conductor pins 40 are brazed to the conductor pads 3. Elements the same as in FIG. 1A are denoted by the same reference numerals.

Figure 5A:
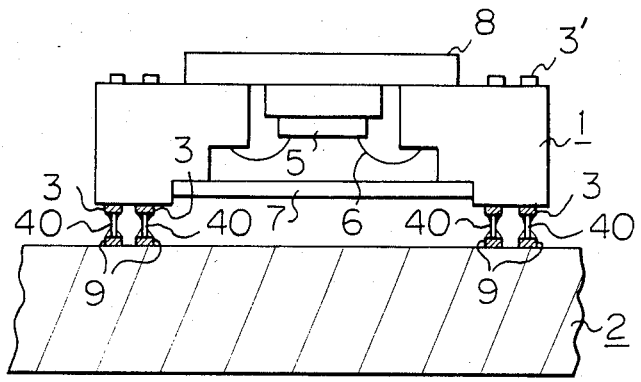
FIG. 5A is an elevational, partially cross-sectional view of an embodiment of a semiconductor device assembly according to the present invention.

The package of FIG. 4 is soldered through the conductor pins 40 to pads 9 provided on the top surface of the circuit board 2, as shown in FIG. 5A.

Figure 5B:
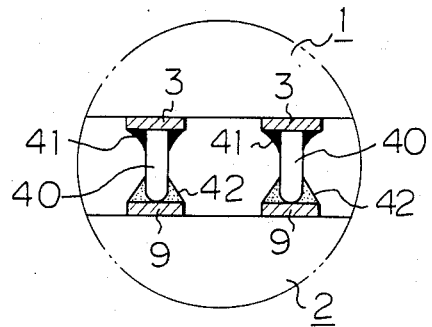
FIG. 5B is an enlarged cross-sectional view of connecting portions shown in FIG. 5A.

FIG. 5B is an enlarged cross-sectional view of the connecting portions shown in FIG. 5A. In FIG. 5B, the package 1 and the circuit board 2 have conductor pads 3 and 9 on the respective surface thereof. The conductor pads 3 of the package 1 are formed as a metallized layer during sintering of the ceramic substrate and are plated with nickel. The conductor pins 40 are brazed to the metallized conductor pads 3 with silver alloy 41, such as silver and copper, at a brazing temperature of 800° C. to 850° C. The conductor pins 40 are fixed to the surface of the conductor pads 3 in a substantially vertical contact condition. Then, the surface of the conductor pads 3, conductor pins 40, and silver alloy 41 are generally plated with nickel and gold, i.e., two plating layers. The other conductor pads 3' are provided on the other side of the package. These are used for test pins.

In mounting the package 1 on the circuit board 2, the conductor pins 40 are soldered to conductor pads 9 of the circuit board 2 using solder 42 at a well-known soldering temperature of, for example, 150° C. to 200° C. The conductor pads 9 consist of a copper layer plated with soft solder consisting of, for example, lead or tin alloy and the like.

If the conductor pads 3 are 0.2 to 0.25 mm square, conductor pins 40 having a length of 0.5 to 1.5 mm and a diameter of 0.1 to 0.2 mm are preferably used.

The conductor pins are preferably made of a low expansion coefficient alloy such as Iron-Nickel alloy, Iron-Nickel-Cobalt alloy, or tungsten, molybdenum, or copper alloy which have strengths of 200 g to 400 g/Iron-Nickel-Cobalt alloy pin.

The structure shown in FIG. 4 has the merits that when the package is electrically connected to the circuit board or the like, the thermal stress generated during the operation of the assembly can be absorbed by the conductor pins 40 since they act as buffers of thermal stress. Thus, fractures of the connecting portions can be prevented.

Figure 6A:
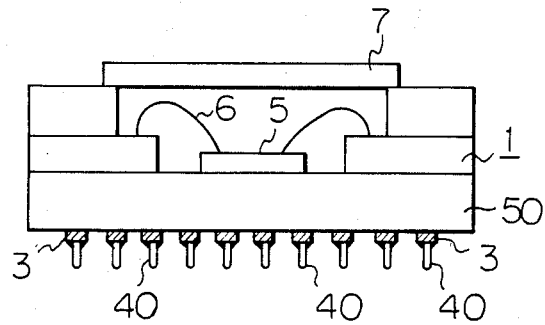
FIG. 6A is an elevational, partially cross-sectional view of another embodiment of a package according to the present invention.
Figure 6B:
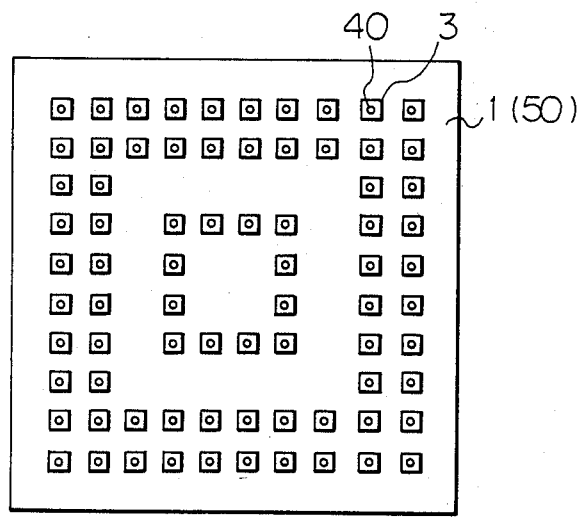
FIG. 6B is a plan view of the package shown in FIG. 6A.

FIG. 6A is an elevational, partially cross-sectional view of another embodiment of a package according to the present invention. FIG. 6B is a schematic plan view of FIG. 6A.

As illustrated in FIGS. 6A and 6B, there are provided conductor pads 3 provided with conductor pins 40 on almost the entire back surface of the package 1. In this embodiment, the semiconductor chip 5 is mounted on the base substrate 50 and the conductor pins 40 are provided on the same base substrate 50. Furthermore, the base substrate comprises a multi-layer ceramic substrate in which signal lines and through holes are provided for connection between the chip 5 and the conductor pins 40. Therefore, the conductor pins 40 can be provided on the entire back surface of the package 1. The conductor pins 40 are brazed to the conductor pads 3 as explained above. Such a package structure has the same effect as that explained in FIGS. 4 and 5A.

Furthermore, the semiconductor device of the present invention has a structure in which the outer pins, e.g., conductor pins are electrically connected to the conductor pads 9 of the circuit board 2 under a contacting condition which is different from an inserted condition. Normally, the outer pins provided on the package are inserted into holes of the circuit board. However, using holes for insertion of the outer pins means a reduction of pin density and an increase of the package size.

Since the present invention does not use the hole connection type but the contacting connection type which is the same as the leadless package, i.e., the chip carrier having outer pads, not pins, the density of the conductor pins is much higher than that of conventional packages. This means the size of the package can be small and also the density of the semiconductor device packages on the circuit board is high.

We claim:

1. A semiconductor device to be mounted on a circuit board having conductor pads formed thereon, comprising:
   a semiconductor chip;
   a package for mounting said semiconductor chip, having a back surface;
   a plurality of conductor pads provided on the back surface of said package; and
   a plurality of conductor pins, fixed to the surface of said plurality of conductor pads and extending from said plurality of conductor pads in a substantially vertical contact condition, for contacting the circuit board, said conductor pins comprising an alloy selected from the group of low expansion coefficient alloys, tungsten alloy, molybdenum alloy, and copper alloy, each of said conductor pins including:
   a first end brazed to said conductor pads of said package with a first adhesive material having a first adhesion temperature and;
   a second end brazed to the conductor pads on the circuit board with a second adhesive material having a second adhesion temperature which is lower than said first adhesion temperature.

2. A semiconductor device according to claim 1, wherein said conductor pins are brazed to said conductor pads.

3. A semiconductor device according to claim 2, wherein said conductor pins are brazed to said conductive pads with silver alloy.

4. A semiconductor device according to claim 2, wherein said conductor pins are brazed to said conductor pads at a temperature of 800° C. to 850° C.

5. A semiconductor device according to claim 1, wherein said conductor pads are provided on substantially the entire back surface of said package.

6. A semiconductor device assembly comprising:
   a semiconductor chip;
   a package for mounting said semiconductor chip, said package having a back surface;
   a plurality of first conductor pads provided on the back surface of said package;
   a plurality of conductor pins having first and second ends, said first ends fixed to the surface of said first conductor pads, said conductor pins extending from said first conductor pads in a substantially vertical contact condition and comprising an alloy selected from the group of low expansion coefficient alloys, tungsten alloy, molybdenum alloy, and copper alloy; and
   a circuit board having a plurality of second conductor pads mounted thereon, contacting said second ends of said conductor pins, said first ends of said conductor pins being brazed to said first conductor pads with a first adhesive material having a first adhesion temperature and said second ends of said conductor pins being brazed to said second conductor pads with a second adhesive material having a second adhesion temperature which is lower than said first adhesion temperature.

7. A semiconductor device assembly according to claim 6, wherein said first and second ends of said conductor pins are brazed to said first and second conductor pads, respectively.

8. A semiconductor device assembly according to claim 7, wherein said first and second ends of said conductor pins are brazed to said first and second conductor pads, respectively, at a temperature of 800° C. to 850° C.

9. A semiconductor device assembly according to claim 6, wherein said second ends of said conductor pins are electrically connected to said second conductor pads of said circuit board by soldering.

10. A semiconductor device assembly according to claim 9, wherein said second ends of said conductor pins are soldered to said second conductor pads using lead alloy or tin alloy.

11. A semiconductor device assembly according to claim 9, wherein said second ends of said conductor pins are soldered to said second conductor pads at a temperature of 150° C. to 200° C.

12. A semiconductor device assembly according to claim 6, wherein said first conductor pads are provided on substantially the entire back surface of said package.

* * * * *